United States Patent [19]
Dobrovolny

[11] Patent Number: 5,280,648
[45] Date of Patent: Jan. 18, 1994

[54] DOUBLE-BALANCED HIGH LEVEL WIDE BAND RF MIXER

[75] Inventor: Pierre Dobrovolny, North Riverside, Ill.

[73] Assignee: Zenith Electronics Corporation, Glenview, Ill.

[21] Appl. No.: 746,387

[22] Filed: Aug. 16, 1991

Related U.S. Application Data

[63] Continuation-in-part of Ser. No. 593,711, Oct. 5, 1990, abandoned, which is a continuation-in-part of Ser. No. 281,156, Dec. 6, 1988, Pat. No. 5,027,163.

[51] Int. Cl.$^5$ .............................................. H04B 1/26
[52] U.S. Cl. ..................... 455/326; 455/333; 333/25; 333/119; 307/529
[58] Field of Search .................. 455/323, 326, 333; 307/529; 333/25, 26, 117, 119

[56] References Cited

U.S. PATENT DOCUMENTS

| | | | |
|---|---|---|---|
| 4,216,431 | 8/1980 | Shibata et al. | 455/326 |
| 4,823,400 | 4/1989 | Dobrovolny | 455/326 |
| 4,912,520 | 3/1990 | Yamamoto et al. | 455/326 |
| 4,979,233 | 12/1990 | Kawahata | 455/326 |
| 5,027,163 | 6/1991 | Dobrovolny | 455/323 |
| 5,060,298 | 10/1991 | Waugh et al. | 455/326 |

FOREIGN PATENT DOCUMENTS 0002411 1/1989 Japan .............................. 455/326

OTHER PUBLICATIONS

"High Dynamic Range Mixing"; Oxner, Ed *Ham Radio* Mar. 1988; pp. 10-12 and 14.
"A GaAs MESFET Mixer with Very Low Intermodulation" Maas, Stephen; IEEE Transactions on Microwave Theory; vol. MTT-35 No. 4; Apr. 1987.
"A Commutation Double-Balanced MOSFET Mixer of High Dynamic Range"; Oxner, Ed; Siliconix; Jan. 1986, pp. 5-14.
Oxner, Ed "FETS in Balanced Mixers" Siliconix Application Note, 1972, pp. 1-15.
Oxner, Ed "Junction FET's in Active Double-Balanced Mixers", Siliconix Application Notes, 1973 pp. 1-2.

*Primary Examiner*—Reinhard J. Eisenzopf
*Assistant Examiner*—Andrew Faile

[57] ABSTRACT

A double-balanced wide band RF mixer includes a first bifilar balun transformer coupling a high level source of RF signal to the primary windings of a pair of trifilar balun transformers. The two output windings of each trifilar transformer are connected in series with the drain-source circuits of a pair of FET transistors which are alternately activated by a symmetric local oscillator signal. An IF signal with reduced second order products of the RF signal is developed between the output windings of the two trifilar balun transformers.

13 Claims, 5 Drawing Sheets

DOUBLE-BALANCED HIGH LEVEL WIDE BAND RF MIXER

CROSS REFERENCE TO RELATED APPLICATION

This application is a continuation-in-part of Ser. No. 593,711, filed Oct. 5, 1990, abandoned which is a continuation-in-part of Ser. No. 281,156 filed Dec. 6, 1988, now U.S. Pat. No. 5,027,163.

BACKGROUND OF THE INVENTION AND PRIOR ART

This invention relates in general to CATV mixers and in particular to commutating type single and double-balanced resistive RF mixers that are operable with high level RF input signals.

It is known, for example, to provide a receiver having an ultra high frequency upconverting mixer wherein a local oscillator (LO) frequency of 1.1 gigahertz is used to develop a 600 megahertz intermediate frequency (IF) from a 500 MHz radio frequency (RF) input signal. In many applications the signal to noise ratio of the receiver is critical, making it desirable to pre-amplify the received RF signal so that it can be processed in a linear manner by the mixer. Any non-linearities, such as those present in conventional diode mixers, give rise to intermodulation and other forms of distortions. Because of their relatively linear channel resistance, GaAs MESFETS have been used in an unbiased drain configuration to form narrow band, signal-ended resistive mixers. The solution to the problem of achieving low intermodulation distortion with high signal handling capacity in a wideband balanced mixer has, however, still eluded the art.

In an article entitled "A GaAs MESFET Mixer With Very Low Intermodulation," by Steven A. Mass in the IEEE Transactions on Microwave Theory Techniques, Volume MTT-35, #4, April, 1987, the foregoing prior art type of resistive mixer for high frequencies is described. The mixer described has low intermodulation distortion but, since it is a single-ended device, i.e., it uses a single GaAs MESFET with both RF and IF signals appearing across the drain-source terminals of the MESFET, it is usable over only a relatively narrow frequency range, thereby limiting its use in many applications.

Another article, entitled "High Dynamic Range Mixing With the Si8901", by Ed Oxner in the March, 1988 issue of hr (ham radio), shows a doubly balanced commutation-type MOSFET mixer. The mixer is constructed in a bridge configuration with four MOSFETS and is usable over a relatively wide frequency range. This mixer suffers a disadvantage in that the source terminals of the MOSFETS cannot be connected to ground. Furthermore, the symmetric LO source feeding the gate electrodes is not an ideal floating source. Consequently, the control voltage applied to the gates is a combination of the LO voltage and the RF or IF voltage and the mixer switching action can be readily affected by signals other than the LO signal, which is certainly not an ideal situation. A similar mixer is shown in Siliconix Application Note AN85-2, "A Commutation Double-Balanced MOSFET Mixer of High Dynamic Range", January 1986.

The commutating single-balanced resistive mixer of the cross-referenced application Ser. No. 281,156, U.S. Pat. No. 5,027,163 includes a very tightly coupled trifilar balun transformer for commutating the RF signal into the IF port and includes a pair of GaAs MESFETS for high speed switching. The mixer has a relatively low conversion loss (about 6db), good 50 ohm matching at both the RF and If ports, a two-tone third order intercept of about +36 dBm to +40 dBm and is capable of converting an RF frequency range of about 50-550 MHz into an IF frequency of about 600 MHz.

The commutating double-balanced resistive mixer of the present invention provides improved noise performance and has the added advantage of decreased LO leakage into the RF port and even order intermodulation products of the RF signal.

OBJECTS OF THE INVENTION

A principal object of the invention is to provide an improved high level wide band resistive mixer.

Another object of the invention is to provide a novel double-balanced resistive mixer for high level wide band RF signals.

A still further object of the invention is to provide a high level resistive mixer which can be integrated with a symmetric local oscillator source on a common GaAs chip, except for the RF and IF input baluns.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
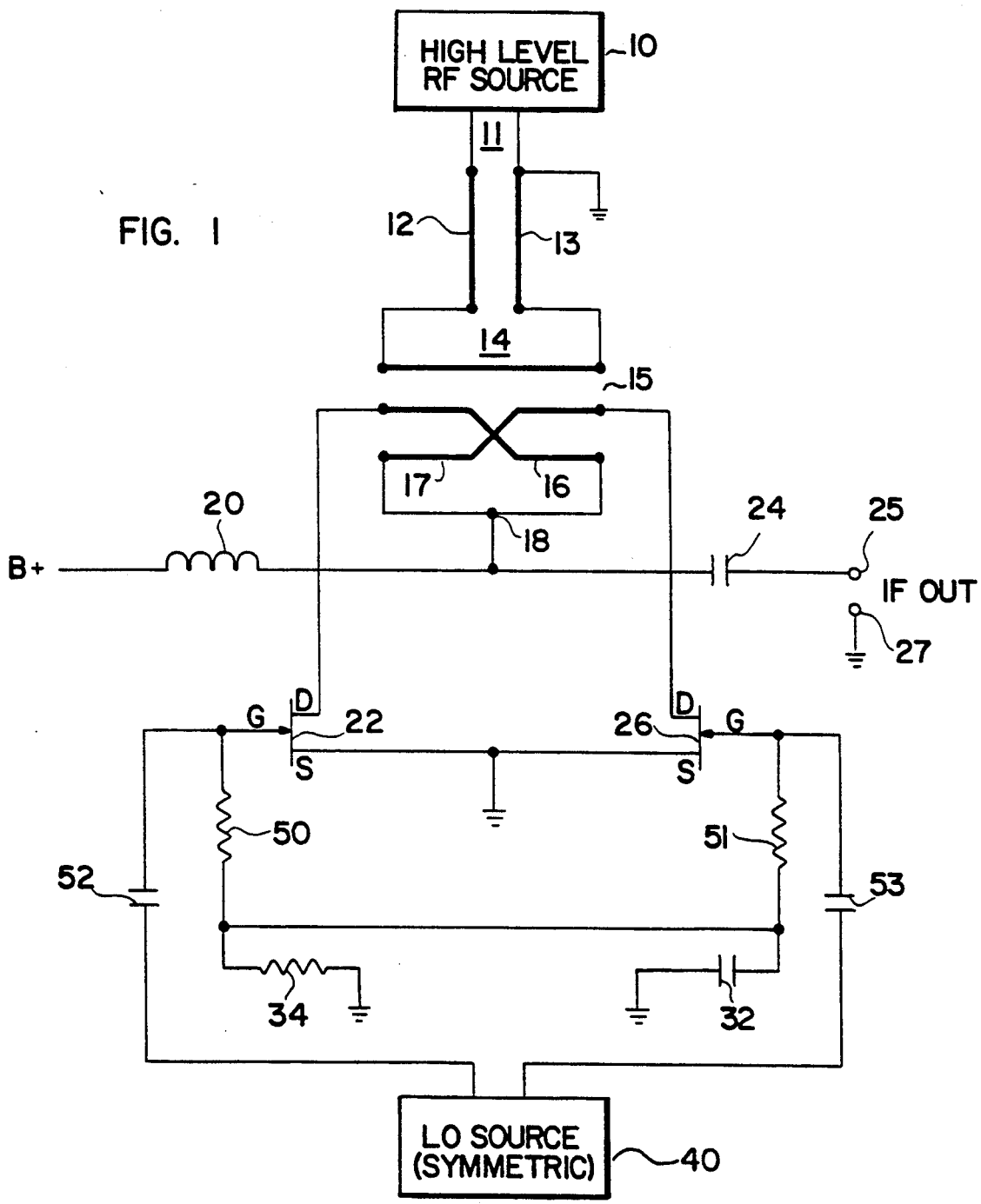
FIG. 1 is a partial block, partial schematic diagram of an RF mixer constructed in accordance with the invention.

Referring to FIG. 1, a source of high level RF signal 10 is shown coupled to a bifilar balun transformer 11 including a pair of windings 12 and 13 wound on a small toroidal ferrite core (not shown). As will be appreciated, windings in such a high frequency balun transformer are generally very tightly coupled together. The windings are illustrated in the drawings as heavy lines. Balun transformer 11 is in turn coupled to a trifilar transformer 14 that includes an input winding 15 and a pair of output windings 16 and 17, with output windings 16 and 17 each having one terminal connected together at a common junction 18. Windings 16 and 17 have their other terminals connected to respective drain electrodes of a pair of GaAs MESFET devices 22 and 26, respectively. These devices may comprise, for example, NEC MESFETS NE72084. The source electrodes of the MESFET devices 22 and 26 are connected to ground and the gate electrodes are connected to a symmetric LO source 40 through a pair of capacitors 52 and 53. Resistors 34, 50 and 51 together with capacitors 32, 52 and 53 lower the RF gate-ground impedance of devices 22, 26 and develop a negative gate bias voltage therefor. Junction 18 is connected to a source of low positive B+ voltage (about 1.0 volts or less) through a choke 20 and, through a capacitor 24, to an IF output terminal 25 which, together with a grounded terminal 27, comprises the IF output port of the mixer. The negative gate bias and positive B+ voltage are selected so as to provide minimum distortion and conversion loss. Also, the positive B+voltage may cause some undesired leakage of the LO signal into the RF port and may also increase the mixer noise figure. This may be overcome by suitable LO filtering at the RF port or by combining two individual mixers, each as shown in FIG. 1, in a double-balanced embodiment, or both.

Figure 2:
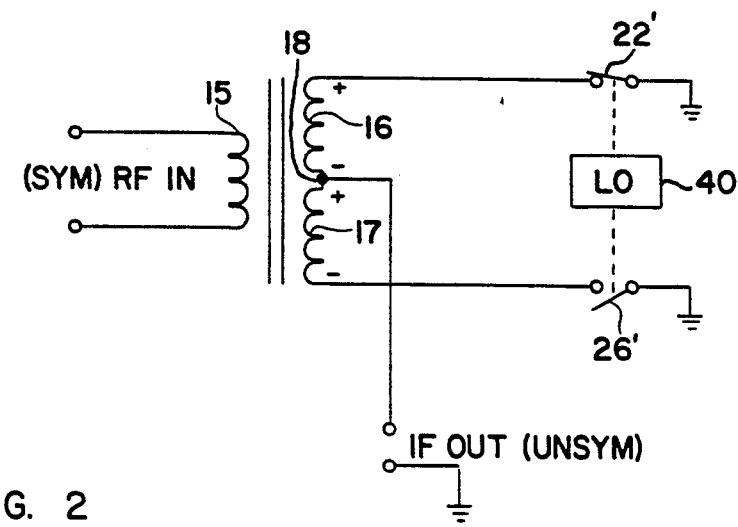
FIG. 2 is a simplified partial schematic diagram of the commutating mixer of the invention.

In FIG. 2, a simplified schematic diagram of the circuit arrangement of FIG. 1 is shown. As indicated, winding 15 serves as an RF input and induces like-polarity voltages of equal value in serially connected windings 16 and 17. The MESFETS 22 and 26 are represented by switches 22' and 26', respectively, and are effective to alternately connect the free terminals of windings 16 and 17 to ground when the switches 22' and 26' are closed under control of LO 40, i.e., at the local oscillator frequency. As mentioned, the signal from local oscillator 40 is symmetrical, as is the RF input signal across winding 15. The effect of these signals is to commutate or switch the polarity of the RF signal developed at the IF output terminal, the switching rate being determined by the local oscillator frequency.

Figure 3:
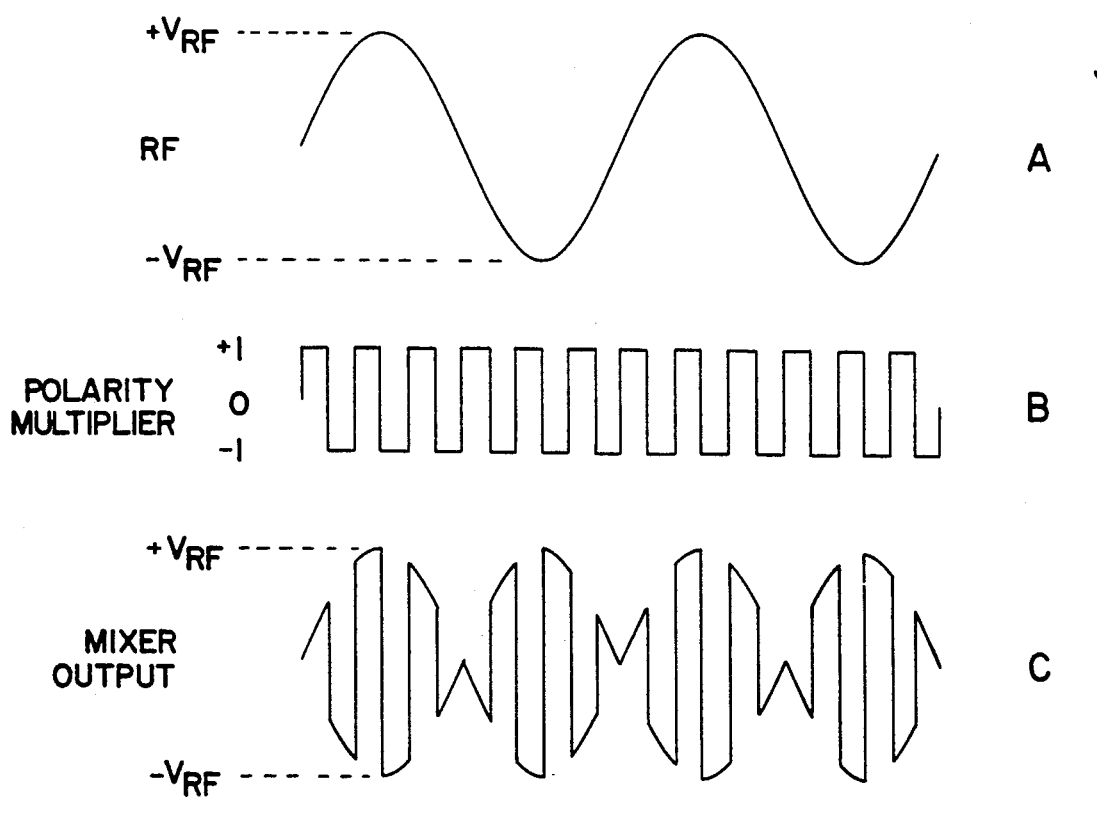
FIG. 3 is a series of waveforms illustrating the commutating action of the mixer of the invention.

Reference to FIG. 3 shows the effects of the commutation action, with waveform A representing an RF input signal; waveform B, a local oscillator-controlled polarity multiplier (i.e., representing the action of LO-controlled switches 22' and 26'); and waveform C, the resultant output signal available at the IF output terminal of the mixer. It will be understood that waveform C includes a multiplicity of harmonics, including the desired IF output frequency which may be derived by suitable filtering.

The operation of the commutating mixer of the invention is thus seen to be relatively straightforward. The benefit obtained by the use of a pair of high speed linear GaAs MESFETS supplied with a symmetrical RF input signal and a symmetrical LO switching signal is that almost instantaneous switching transitions with minimum intermodulation distortion are produced.

Figure 4:
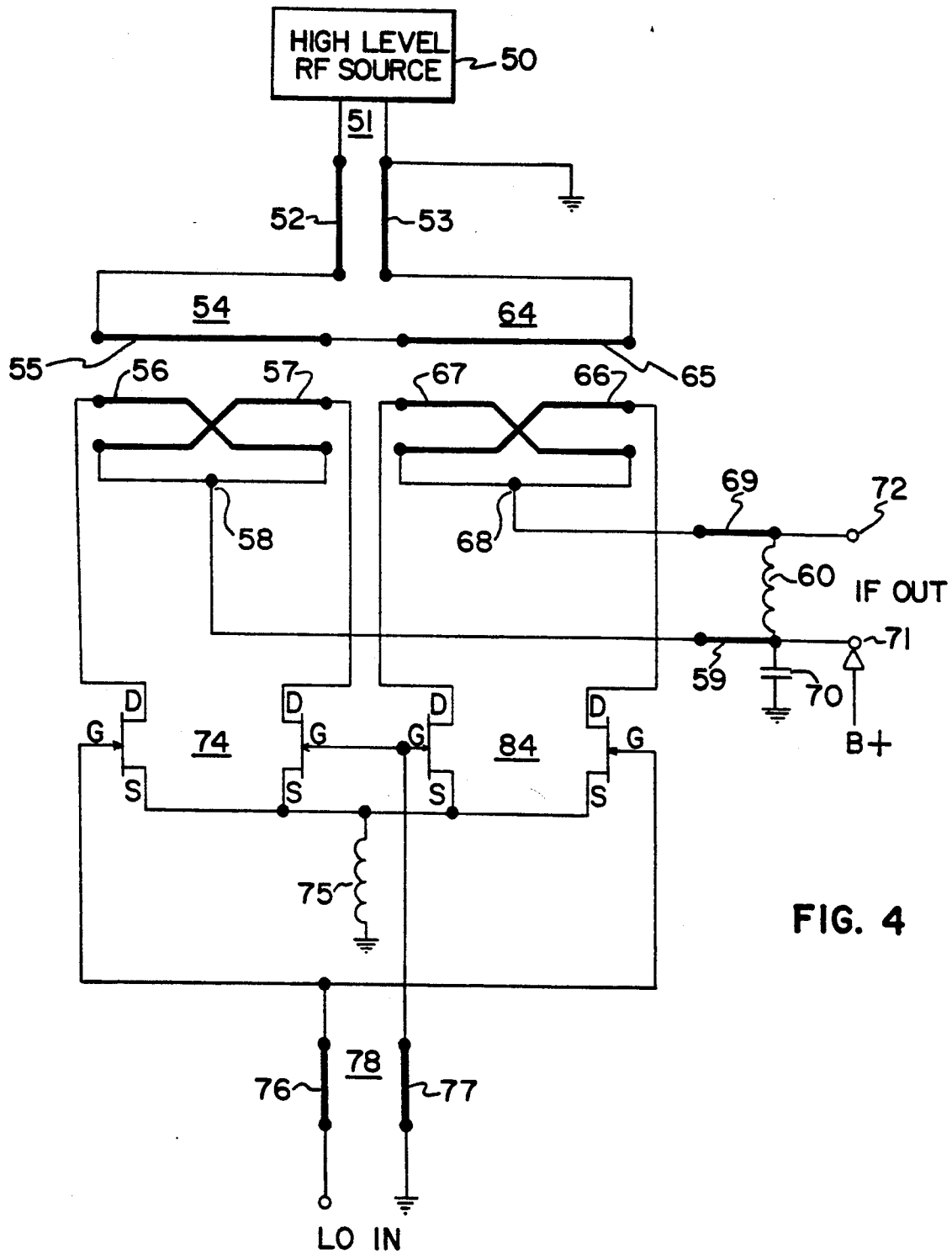
FIG. 4 is a simplified partial schematic diagram of the double-balanced mixer of the invention.

In the double-balanced mixer of the invention shown in FIG. 4, a high level RF source 50 supplies a bifilar balun 51 having windings 52 and 53 coupled to a pair of serially connected trifilar RF transformers 54 and 64. The trifilar transformers consist of primary input windings 55 and 65 and pairs of secondary output windings 56-57 and 66-67, respectively. Output windings 56 and 57 of trifilar transformer 54 have one end connected together at a terminal 58. Output windings 66 and 67 of trifilar transformer 64 have one end connected together at a terminal 68. Terminals 58 and 68 are connected to another bifilar balun having windings 59 and 69, across which is coupled a choke coil 60. One end of choke coil 60 is connected to IF output terminal 72 and the other to IF output terminal 71. A source of B+(about 1 volt or less) is connected to terminal 71 and a bypass capacitor 70 couples terminal 71 to ground.

The other ends of output windings 56-57 and 66-67 are coupled respectively to the drain electrodes of respective pairs of GaAs MESFET devices 74 and 84, respectively. The gate electrodes of corresponding MESFET devices in each pair are connected together and all of the source electrodes are connected to a DC ground through a common high RF impedance choke coil 75. Choke coil 75 has insignificant DC resistance and may be replaced by a transistor or suitable current source, or, alternatively, the source electrodes may be coupled directly to ground. A first set of gate connections for the pairs of MESFET devices 74 and 84 is connected to one winding 76 of a bifilar balun 78 and a second set of gate connections is connected to the other winding 77 of the bifilar balun 78. The LO signal is impressed across bifilar balun 78.

Figure 5:
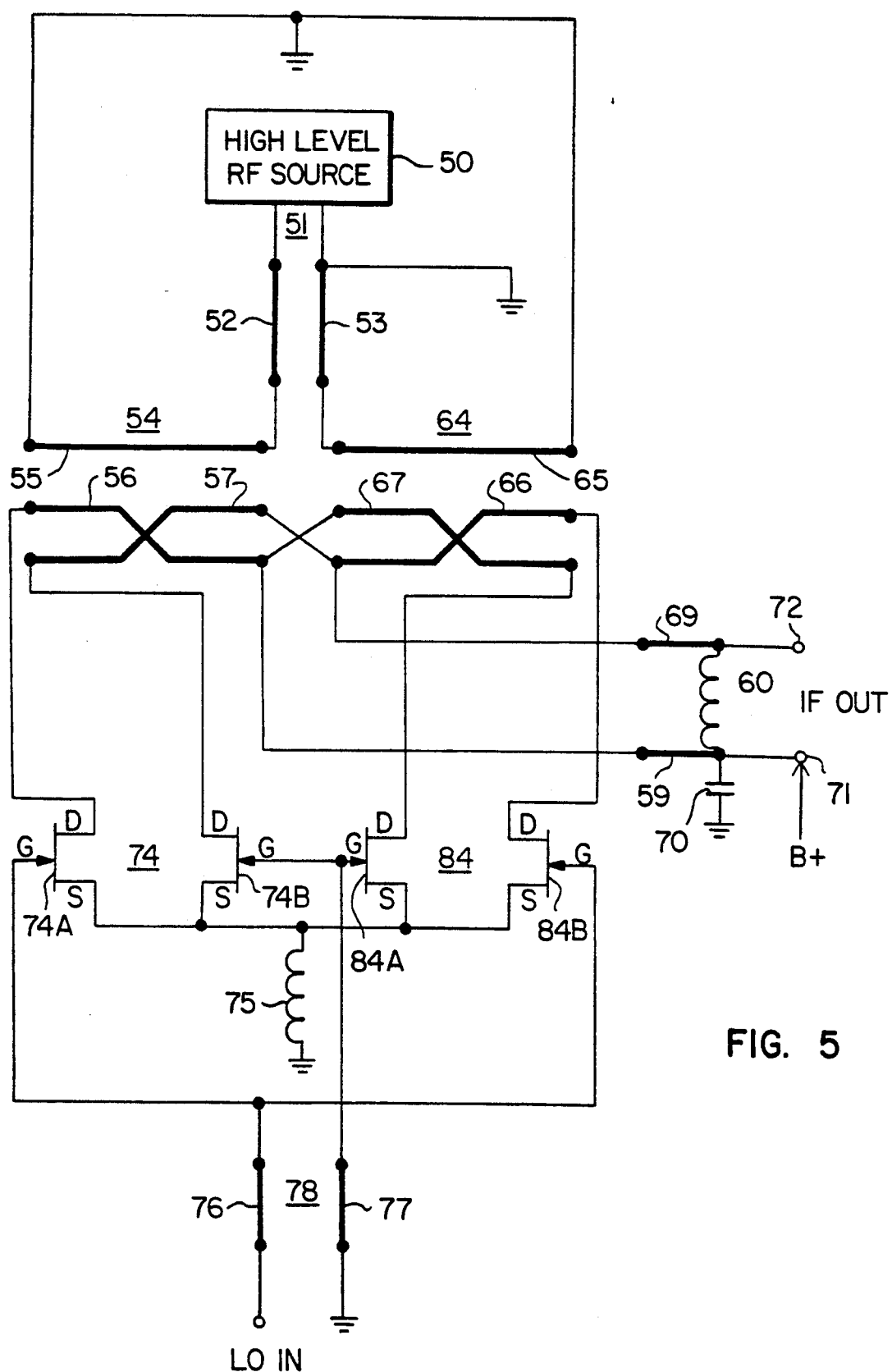
FIG. 5 is a simplified partial schematic diagram of an alternate embodiment of the double-balanced mixer of the invention.

An alternate embodiment of the double-balanced mixer of the invention is illustrated in FIG. 5. The embodiment of FIG. 5 is similar to the embodiment shown in FIG. 4, except for the connections associated with trifilar RF transformers 54 and 64. In particular, in the FIG. 5 embodiment, windings 52 and 53 of bifilar balun 51 are shown as connected to the opposite ends of primary windings 55 and 65 respectively from the corresponding connections of the FIG. 4 embodiment with the other ends of the primary windings being connected together at a common ground. Also, in contrast to the FIG. 4 embodiment, the secondary winding pairs 56,57 and 66, 67 are not connected in series but rather are cross-coupled with each other. That is, winding 56 of transformer 54 is cross-coupled with winding 67 of transformer 64 to form a series circuit with the drain-source circuits of transistors 74A and 84A. Similarly, winding 57 of transformer 54 is cross-coupled with winding 66 of transformer 64 to form a series circuit with the drain-source circuits of transistors 74B and 84B. It will be noted that each of these two series circuits includes two alternately activated transistors, one from each transistor pair 74 and 84. Finally, the IF port is coupled between the common junctions formed between cross-coupled windings 57, 66 and 56, 67.

Figure 6:
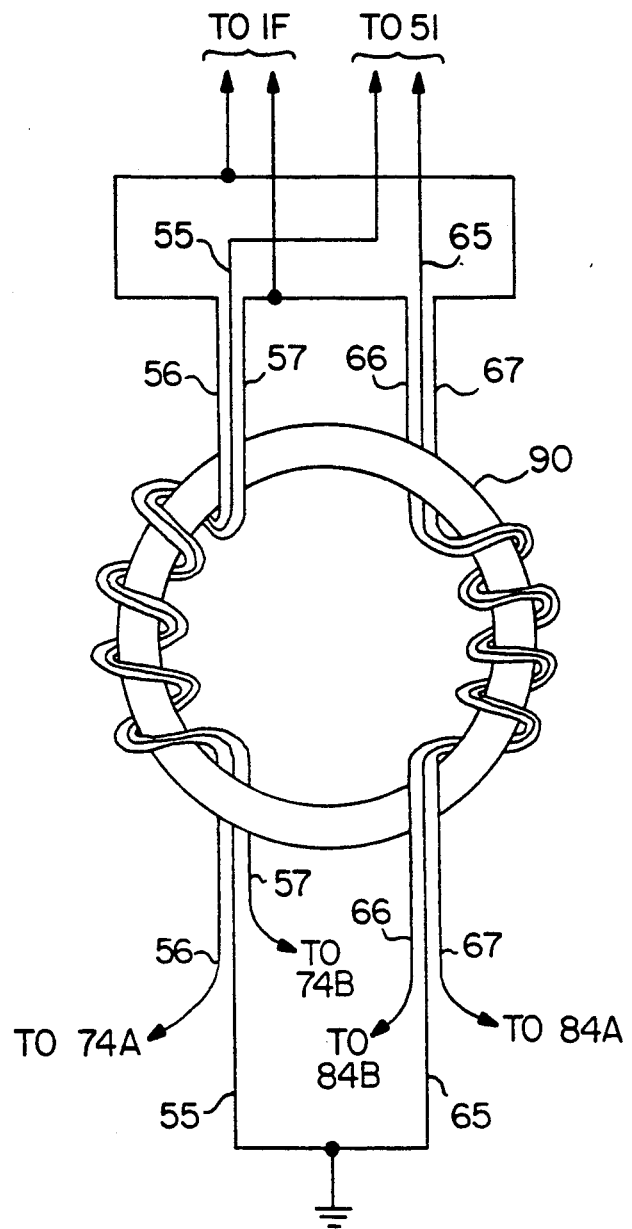
FIG. 6 illustrates a common toroidal core about which the trifilar windings 54 and 64 of the FIG. 5 embodiment are wound.

While the trifilar transformers 54 and 64 of the FIG. 5 embodiment may be wound on separate toroidal cores, they are preferably wound on a common core 90 as illustrated in FIG. 6. Thus, as shown, each set of trifilar windings 55,56,57 and 65, 66,67 is wound in an appropriate sense about a separate section of toroidal core 90. For an RF frequency range of about 50-800 MHz and an LO frequency range of about 960-1720 MHz, core 90 may have an outer diameter of about 84 mils, an inner diameter of about 50 mils and a thickness of about 25 mils, with each set of trifilar windings comprising four turns. Also, the sets of windings may be disposed substantially opposite each other with each set being wound about approximately 90 degrees of the core.

The double-balanced mixers of FIGS. 4 and 5, while providing an improved noise figure, operate similar to the single-balanced mixer described above except that even order harmonic products of the RF signal are decreased in the IF port (terminals 71 and 72). It should be noted that if more than one RF signal is present, as is common in converters, the resulting intermodulation will also be reduced. Also, LO leakage into the RF port will be suppressed.

It will be appreciated that the self-biasing networks for the gates of the MESFETS have been omitted for clarity since they are identical to those illustrated for the circuit of FIG. 1.

In the embodiments of the mixer illustrated in the drawings, the RF port has been considered the input port and the IF port the output port. These designations may, however, be readily interchanged or reversed with either port serving as the input port and the other port as the output port. Thus, in a more general sense, the two ports may be referred to as first and second input/output ports, with either of the two ports receiving an input signal and the other developing an output signal.

It will be appreciated that numerous modifications and changes in the described embodiment of the invention will occur to those skilled in the art without departing from its true spirit and scope. The invention is to be limited only as defined in the claims.

What is claimed is:

1. A double balanced mixer circuit comprising:
   first means providing a first input/output port;
   first and second transformer means, each coupled to said first means and each having first, second and third windings;
   first and second pairs of transistors, each transistor having a source terminal, a drain terminal and a gate terminal;
   means connecting one of said second and said third windings in each of said first and second transformer means in series with the drain and source terminals of a first of said transistors in each of said first and second pairs of transistors;
   connecting means for connecting the other of said second and said third windings of said first and second transformer means in series with the drain and source terminals of a second of said transistors in each of said first and second pairs of transistors;
   means for coupling a symmetrical local oscillator signal for alternately activating the gate terminals of each of said first and second pairs of transistors; and
   a second output/input port coupled between one of said second and said third windings of each of said first and second transformer means.

2. The mixer of claim 1 wherein said connecting means connects said second and said third windings of each of said first and second transformer means in series with the drain and source terminals of a corresponding one of said first and said second transistors in each of said first and second pairs of transistors.

3. The mixer of claim 1 wherein said connecting means connects said second windings of said first and second transformer means in series with the drain and source terminals of said first transistor of each of said first and second transistor pairs, said first transistors being alternately activated by said local oscillator signal, and connecting said third windings of said first and second transformer means in series with the drain and source terminals of said second transistor of each of said first and second transistor pairs.

4. The mixer of claim 3 wherein said first and second transformer means comprise respective first and second trifilar windings wound about a common toroidal core.

5. The mixer of claim 1 wherein said first means comprises a bifilar balun transformer.

6. The mixer of claim 1 wherein each of said transistors comprises a MESFET.

7. A double balanced mixer circuit comprising:
   first means providing a symmetric high level RF input signal;
   first and second trifilar transformer means, each coupled to said first means and each having first, second and third windings;
   first and second pairs of transistors, each transistor having a D.C. grounded source terminal, a drain terminal and a gate terminal;
   connecting means for connecting said second and third windings of each of said first and second trifilar transformer means in series with the drain and source terminals of a corresponding one of the transistors in each of said first and second pairs of transistors;
   second means for coupling a symmetrical local oscillator signal for alternately activating the gates of each of said first and second pairs of transistors; and
   an IF port coupled between the junction formed between said second and said third windings of each of said first and second trifilar transformer means for developing an output signal including a desired intermediate frequency component.

8. The mixer of claim 7 wherein said first means comprises a bifilar balun transformer.

9. The mixer of claim 7 wherein each of said transistors comprises a MESFET.

10. A double balanced mixer circuit comprising:
    first means providing a symmetric high level RF input signal;
    first and second trifilar transformer means, each coupled to said first means and each having first, second and third windings;
    first and second pairs of transistors, each transistor having a D.C. grounded source terminal, a drain terminal and a gate terminal;
    a local oscillator signal for alternately activating the gates of each of said first and second pairs of transistors;
    connecting means for connecting said second windings of said first and second trifilar transformer means in series with the drain and source terminals of a first transistor in each of said first and second transistor pairs, said first transistors being alternately activated by said local oscillator signal, and connecting said third windings of said first and second trifilar transformer means in series with the drain and source terminals of second transistors in each of said first and second transistor pairs; and
    an IF port coupled between the second winding of one of said first and second trifilar transformer means and the third winding of the other of said first and second trifilar transformer means for developing an output signal including a desired intermediate frequency component.

11. The mixer of claim 10 wherein said first and second trifilar transformer means comprise respective first and second trifilar windings wound about a common toroidal core.

12. The mixer of claim 10 wherein said first means comprises a bifilar balun transformer.

13. The mixer of claim 10 wherein each of said transistors comprises a MESFET.

* * * * *